(12) United States Patent
Xing et al.

(10) Patent No.: US 10,411,670 B2
(45) Date of Patent: Sep. 10, 2019

(54) COMPACT BROADBAND COMMON-MODE FILTER

(71) Applicant: Western Digital Technologies, Inc., San Jose, CA (US)

(72) Inventors: Xinzhi Xing, San Jose, CA (US); Albert Wallash, Morgan Hill, CA (US); John Contreras, Palo Alto, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 165 days.

(21) Appl. No.: 15/633,865

(22) Filed: Jun. 27, 2017

(65) Prior Publication Data

US 2018/0376580 A1    Dec. 27, 2018

(51) Int. Cl.
*H03H 1/00* (2006.01)
*H03H 7/42* (2006.01)
(Continued)

(52) U.S. Cl.
CPC ......... *H03H 1/0007* (2013.01); *H01P 1/2013* (2013.01); *H03H 7/427* (2013.01);
(Continued)

(58) Field of Classification Search
CPC .. H05K 1/0228; H05K 1/0225; H05K 1/0245; H05K 3/0017; H05K 1/18;
(Continued)

(56) References Cited

U.S. PATENT DOCUMENTS 6,088,235 A    7/2000    Chiao et al.
6,956,444 B2   10/2005   Miller
(Continued)

FOREIGN PATENT DOCUMENTS

TW    M385809    8/2010

OTHER PUBLICATIONS

Boutejdar, A., et al., "New Low-Pass Filter Design Using Compensated Microstrip Capacitor and Coupled Meander Defected Ground Structure (DGS)," 2009 German Microwave Conference, Mar. 16, 2009.
(Continued)

*Primary Examiner* — Rakesh B Patel
*Assistant Examiner* — Jorge L Salazar, Jr.
(74) *Attorney, Agent, or Firm* — Krista S. Jacobsen; Jacobsen IP Law

(57) ABSTRACT

Disclosed herein are printed circuit boards with at least one signal trace situated over or under a reference plane. The reference plane includes a broadband common-mode filter that comprises looping and parallel structures etched into the reference plane. The looping structure includes an even number of side arms, and the parallel structure comprises an even number of interior arms, wherein each of the side arms extends toward the parallel structure, and each of the interior arms extends toward the looping structure. The at least one signal trace is substantially parallel to the side arms and to the interior arms, and is situated between a first half of the even number of side arms and a second half of the even number of side arms and between a first half of the even number of interior arms and a second half of the even number of interior arms.

23 Claims, 9 Drawing Sheets

(51) Int. Cl.
H05K 1/02 (2006.01)
H05K 1/18 (2006.01)
H05K 3/00 (2006.01)
H01P 1/201 (2006.01)
H01P 3/02 (2006.01)

(52) U.S. Cl.
CPC ......... H05K 1/0225 (2013.01); H05K 1/0228 (2013.01); H05K 1/0245 (2013.01); H05K 1/18 (2013.01); H05K 3/0017 (2013.01); H01P 3/026 (2013.01); H05K 2201/10015 (2013.01)

(58) Field of Classification Search
CPC ....... H05K 2201/10015; H03H 1/0007; H03H 7/427; H01P 1/2013; H01P 3/026
USPC ... 333/1, 4, 5, 204, 205, 236, 238, 245, 246
See application file for complete search history.

(56) References Cited

U.S. PATENT DOCUMENTS

| | | | |
|---|---|---|---|
| 7,330,325 | B2 | 2/2008 | Vacar et al. |
| 7,656,601 | B1 | 2/2010 | Li |
| 7,932,793 | B2 | 4/2011 | Wu et al. |
| 8,125,727 | B2 | 2/2012 | Tsuwako et al. |
| 8,126,402 | B1 | 2/2012 | Jatou et al. |
| 8,253,509 | B2 * | 8/2012 | Pai ................... H01P 1/20381 333/12 |
| 8,339,212 | B2 | 12/2012 | Wu et al. |
| 8,659,365 | B2 | 2/2014 | Wu et al. |
| 8,907,748 | B2 | 12/2014 | Pajovic |
| 9,059,491 | B2 | 6/2015 | Lim et al. |
| 2010/0321135 | A1 | 12/2010 | Kushta |
| 2011/0273245 | A1 | 11/2011 | Pai et al. |
| 2011/0298563 | A1 | 12/2011 | Pai et al. |
| 2012/0194290 | A1 | 8/2012 | Wu et al. |
| 2016/0142031 | A1 | 5/2016 | Ueki et al. |

OTHER PUBLICATIONS

International Search Report and Written Opinion in PCT Application No. PCT/US2018/022800 (filed Mar. 16, 2018), dated Jun. 29, 2018.

Shu-Jung Wu et al., "A novel HU-shaped common-mode filter for GHz differential signals," 2008 IEEE International Symposium on Electromagnetic Compatibility, Aug. 18, 2008.

Fangxu Yang, et al., "An Ultra-Wideband Common-Mode Noise Filter for Differential Signals Using Compact Patterned Ground Structure," IEEE MTT-S International Microwave Symposium (IMS), May 2016.

Hailing Yue, et al., "Modified Spiral Shaped Defected Ground Structure with Spurious Free Band Rejection Performance," 2016 IEEE 17th Annual Wireless and Microwave Technology Conference (WAMICON), Apr. 2016.

Liu, Qian et al., "Common-Mode Filters With Interdigital Fingers for Harmonics Suppression and Lossy Materials for Broadband Suppression," IEEE Transactions on Electromagnetic Compatibility, vol. 57, Issue 6, Dec. 2015.

Panasonic, "Common mode Noise Filter Array Type: EXC28CG," Nov. 2, 2012.

Shu-Jung Wu, et al., "A Novel HU-shaped Common-mode Filter for GHz Differential Signals," IEEE International Symposium on Electromagnetic Compatibility, Aug. 2008.

Shu-Jung Wu, et al., "A Novel Wideband Common-Mode Suppression Filter for Gigahertz Differential Signals Using Coupled Patterned Ground Structure," IEEE Transactions on Microwave Theory and Techniques, vol. 57, No. 4, Apr. 2009.

TEKTRONIX, "Measurement Solutions for Disk Drive Design," Sep. 2006.

Xian-Ke Gao, et al., "A Compact Common-mode Noise Suppression Filter for High Speed Differential Signals Using Defected Ground Structure," 2015 Asia-Pacific Symposium on Electromagnetic Compatibility (APEMC), May 2015.

* cited by examiner

COMPACT BROADBAND COMMON-MODE FILTER

BACKGROUND

There are many ways to transmit signals over conductors. In single-ended signaling, one conductor carries a signal as a voltage that varies over time. The signal is referenced to a fixed potential, which is usually a 0V node referred to as ground. Thus, one conductor carries the signal and one conductor carries the reference potential. The receiver extracts information by detecting the difference between the signal-carrying conductor and the reference potential.

In differential signaling (sometimes referred to as double-ended signaling), information is transmitted over two conductors using two complementary voltage signals, one over each conductor. One conductor carries the signal, and the other carries the inverted signal. The pair of conductors can be, for example, traces on a printed circuit board (PCB). The receiver extracts information from the pair of conductors by detecting the potential difference between the inverted and non-inverted signals. Ideally, the voltage signals on the two conductors have equal amplitude and opposite polarity relative to a common-mode voltage, in which case they are said to be "balanced." The return currents associated with these voltages also have equal amplitude and opposite polarity and thus cancel each other out; for this reason, differential signals ideally have zero current flowing through the ground connection.

Relative to single-ended signaling, differential signaling offers a number of advantages for high-speed data transfer. For example, if electromagnetic interference (EMI; also referred to as radio-frequency interference (RFI)) or crosstalk (i.e., EMI generated by nearby signals) is introduced from a source outside the differential conductors, it is added equally to the inverted and non-inverted signal. Because the receiver operates on the difference in voltage between the two signals, the receiver circuitry will greatly reduce the amplitude of any interference or crosstalk that is present in the received signal. Thus, differential signals are less sensitive than single-ended signals to EMI, crosstalk, or any other noise that couples into both signals of the differential pair.

Another advantage of differential signaling is that because differential signals have higher EMI immunity than single-ended signals, differential signals can use lower voltages than single-ended signals and still maintain adequate signal-to-noise ratio (SNR). In addition, the SNR with differential signaling is two times that of an equivalent single-ended implementation because the dynamic range at the differential receiver is twice as high as the dynamic range of each signal within the differential pair. Several advantages flow from the ability of differential signaling to successfully transfer data using lower signal voltages, including that supply voltage requirements are lower, which reduces power consumption. In addition, smaller voltage transitions, which are possible because of greater immunity to EMI, allow for higher operating frequencies. Consequently, high-speed digital systems often use differential signaling.

Differential signaling also tends to cause less EMI than single-ended signaling. The rising and falling edges of digital signals can generate significant amounts of EMI, and both single-ended and differential signals generate EMI. But because the currents in the conductors in differential signaling travel in opposite directions, the two signals in a differential pair create electromagnetic fields that are opposite in polarity. If the differential signal paths are identical and in close proximity to each other, the individual electromagnetic fields caused by the two signals will largely cancel each other. If, however, the two signal paths are not identical, the generated magnetic fields will not be exactly equal and opposite and will not completely cancel each other. As a result, the common mode current on the two conductors is able to generate an electromagnetic field outside the pair of conductors, which act like an antenna and radiate EMI. In addition, due to integrated circuit process imperfections, mismatches in the different pair circuit drivers can produce an inherent common-mode signal, which can create EMI.

Although differential signal paths are ideally identical, and the signals carried on the two conductors ideally have equal amplitude and opposite polarity, practical systems using differential signaling typically suffer from intrinsic common-mode noise as well as interference caused by sources outside the differential conductors, and the differential conductors can also radiate EMI and thereby cause interference to external systems or nearby circuits. Collectively, the common-mode noise and interference (whether received or generated) are referred to herein simply as "common-mode noise." Common-mode noise can be caused by clock skew, differences in amplitude between the signals on the two paths, unbalanced routing (e.g., one of the two paths is longer or shorter than the others, or the distance between conductors varies along their lengths, etc.), and other factors. Above the gigahertz frequency range, common-mode interference signals can degrade differential signal integrity and/or power integrity, and the use of differential signaling may also cause EMI. As a consequence, common-mode noise can degrade the SNR of the transmitted signal and cause detection errors. Likewise, single-ended signaling also suffers from noise and EMI, and can also generate EMI that can adversely affect other receivers.

Common-mode noise filters can be used to suppress common-mode noise and protect signal SNR. For example, the signal detection electronics can include a filter circuit, but the inclusion of such a filter circuit can increase the cost of the signal detection electronics. As another example, a common-mode filter can be mounted on the surface of a PCB through which the signal paths are routed. The use of one or more surface-mounted filters increases the cost of the populated PCB. As another example, a narrowband filter can be built into the PCB structure without added cost, but the bandwidth of this type of filter is usually narrow and can only target one frequency at a time. Because a single filter may not provide sufficient attenuation of the common-mode noise, or may not provide sufficient attenuation at all frequencies at which common-mode noise is problematic (e.g., when the common-mode interference signals have a signal at a base frequency and higher harmonics), it may be necessary to use multiple common-mode filters to attenuate the common-mode noise adequately at the frequencies where it is problematic. Even when a single filter should be sufficient, manufacturing tolerances can cause the filter frequency band to shift away from the target frequency, which can reduce the effectiveness of the filter. As a result, the need for one or more filters increases the size of the PCB or reduces the amount of PCB space available for other components.

Therefore, there is an ongoing need for alternative ways to reduce common-mode noise.

SUMMARY

Disclosed herein are common-mode filters embedded into the layers of a PCB, methods of manufacturing such PCBs (e.g., by etching a pattern into one or more reference planes of the PCB), and devices comprising such PCBs (e.g., data storage devices such as hard disk drives). The disclosed filters suppress common-mode noise (i.e., noise intrinsic to a circuit, EMI received by the circuit via the common mode, and EMI radiated by the circuit). The filters provide capacitance and inductance using a structure built into at least one reference plane of the PCB. The disclosed filters are compact and have wide common-mode rejection bands to allow filtering of one or more single-ended or differential signal lines without degrading the transmitted signal, requiring the use of surface-mounted components, or increasing the cost of the PCB. The filters may be tuned to different frequency ranges by changing the dimensions of the filter or by adding built-in capacitance or inductance. The filter characteristics are also largely insensitive to manufacturing tolerances.

Disclosed herein are embodiments of a PCB comprising at least one signal trace extending in a first direction and a first signal reference plane comprising a pattern. In some embodiments, the pattern comprises a first base, a second base, a first side arm, a second side arm, a first interior arm, and a second interior arm. The first base has a first end and a second end extending in a second direction that is substantially perpendicular to the first direction. The first side arm is connected to the first end of the first base and extends toward the second base in a direction that is substantially parallel to the at least one signal trace. The second side arm is connected to the second end of the first base, is substantially parallel to the first side are, and also extends toward the second base. The lengths of the first and second side arms are approximately equal.

The second base is substantially parallel to the first base and has a first end and a second end. The first interior arm is substantially parallel to the first side arm, is connected to the second base at a first distance from the first end of the second base, and extends toward the first base. The second interior arm is also substantially parallel to the first side arm, is connected to the second base at a second distance from the second end of the second base, the second distance being substantially equal to the first distance, and extends toward the first base. The lengths of the first and second interior arms are approximately equal. The at least one signal trace is situated between the first and second side arms and between the first and second interior arms.

In some embodiments, the PCB further comprises a second signal reference plane comprising the pattern, wherein a location of the pattern in the second signal reference plane is substantially identical to a location of the pattern in the first signal reference plane, and the at least one signal trace resides between the first and second signal reference planes.

In some embodiments, the at least one signal trace comprises a single-ended signal trace. In some embodiments, the at least one signal trace comprises a first signal trace and a second signal trace, and wherein the first and second signal traces convey a differential-mode signal. In some embodiments, the at least one signal trace comprises a plurality of signal traces.

In some embodiments, the lengths of the first and second bases are approximately equal. In some embodiments, the distance between the first and second bases is between approximately 2 mm and 5 mm. In some embodiments, the distance between the first and second side arms is between approximately 1.5 mm and 2.5 mm. In some embodiments, the distance between the first and second interior arms is between approximately 0.5 mm and 1.5 mm. In some embodiments, the length of the first side arm is between approximately 2 mm and 5 mm. In some embodiments, the length of the first interior arm is between approximately 2 mm and 5 mm.

In some embodiments, at least one component, such as a capacitor or an inductor, is attached to a surface of the printed circuit board and coupled to the pattern. In some embodiments, the at least one component is coupled between the first and second side arms, or between the first and second interior arms.

In some embodiments, the pattern further comprises a third side arm connected to the first base between the first side arm and the second side arm, and a fourth side arm connected to the first base between the first side arm and the second side arm at a fourth distance from the second end of the first base. The third side arm is connected to the first base at a third distance from the first end of the first base, the third distance being less than the first distance, and the third side arm is substantially parallel to the first side arm. The fourth side arm is connected to the first base at a fourth distance from the second end of the first base, the fourth distance being less than the second distance, and the fourth side arm is substantially parallel to the first side arm. The third and fourth side arms may be shorter, longer, or the same lengths as the first and second side arms, respectively. In some embodiments, the lengths of the third and fourth side arms are approximately equal and are between approximately 2 mm and 5 mm. In some embodiments, the PCB further comprises at least one component, such as a capacitor or inductor, coupled between the first and third side arms, between the first and second side arms, between the third and fourth side arms, or between the second and fourth side arms.

In some embodiments, the pattern further comprises a third side arm connected to the first base between the first side arm and the second side arm at a third distance from the first end of the first base, the third distance being greater than the first distance, the third side arm being substantially parallel to the first side arm; and a fourth side arm connected to the first base between the first side arm and the second side arm at a fourth distance from the second end of the first base, the fourth distance being greater than the second distance, the fourth side arm being substantially parallel to the first side arm. The length of the third side arm may be greater than, less, than, or approximately equal to the length of the fourth side arm. In some embodiments, the length of the third side arm is between approximately 2 mm and 5 mm. In some embodiments, at least one component, such as a capacitor or inductor, is coupled between the first and second side arms.

In some embodiments, a PCB comprises at least one signal trace extending in a first direction, the at least one signal trace for conveying a signal on the printed circuit board, and a broadband common-mode filter comprising a looping structure and a parallel structure. The looping structure, which has an even number of side arms, each of which is substantially parallel to all of the other side arms, is etched into a signal reference plane of the PCB. The parallel structure, which has an even number of interior arms, each of which is substantially parallel to all of the other interior arms and to all of the side arms, is etched into the signal reference plane. Each of the side arms extends toward the parallel structure, and each of the interior arms extends toward the looping structure. The at least one signal trace, which is substantially parallel to the side arms and to the interior arms, is situated between a first half of the even number of side arms and a second half of the even number of side arms, and between a first half of the even number of interior arms and a second half of the even number of interior arms.

In some embodiments, the at least one signal trace comprises a first signal trace and a second signal trace, and the distance between the first signal trace and a first nearest side arm is approximately equal to the distance between the second signal trace and a second nearest side arm. In some embodiments, the distance between the first signal trace and a first nearest interior arm is approximately equal to the distance between the second signal trace and a second nearest interior arm.

In some embodiments, the looping structure has a shape of an open rectangle. In some embodiments, the parallel structure has a shape of a lowercase symbol pi with linear segments.

In some embodiments, the even number of side arms is two or four, and the even number of interior arms is two or four. In some embodiments in which the even number of side arms is two and the even number of interior arms is four, a first side arm of the two side arms is situated between a first interior arm of the four interior arms and a second interior arm of the four interior arms, and a second side arm of the two side arms is situated between a third interior arm of the four interior arms and a fourth interior arm of the four interior arms. In some embodiments in which the even number of side arms is four and the even number of interior arms is two, a first interior arm of the two interior arms is situated between a first side arm of the four side arms and a second side arm of the four side arms, and a second interior arm of the two interior arms is situated between a third side arm of the four side arms and a fourth side arm of the four side arms.

BRIEF DESCRIPTION OF THE DRAWINGS

Objects, features, and advantages of the disclosure will be readily apparent from the following description of certain embodiments taken in conjunction with the accompanying drawings in which.

To facilitate understanding, identical reference numerals have been used, where possible, to designate elements that are common to the figures. It is contemplated that elements disclosed in one embodiment may be beneficially utilized on other embodiments without specific recitation.

DETAILED DESCRIPTION

In the following, reference is made to embodiments of the disclosure. It should be understood, however, that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim.

Figure 1:
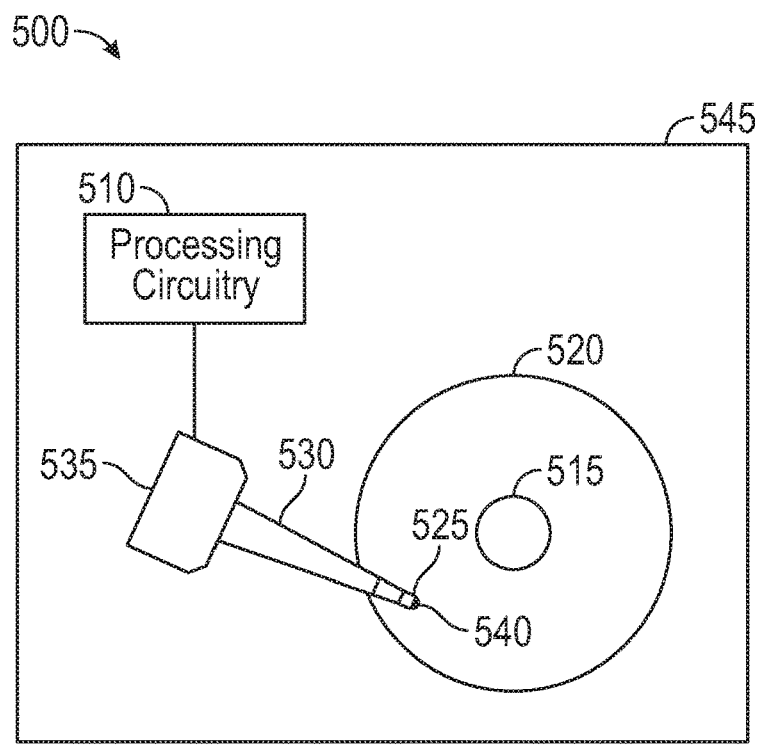
FIG. 1 illustrates several components of an exemplary hard disk drive in accordance with some embodiments.

FIG. 1 illustrates several components of an exemplary hard disk drive 500 that may include some embodiments. The magnetic hard disk drive 500 includes a spindle 515 that supports and rotates a magnetic disk 520. The spindle 515 is rotated by a spindle motor (not shown) that is controlled by a motor controller (not shown) that may be implemented in electronics of the hard disk drive 500. A slider 525, which is supported by a suspension and actuator arm 530, includes a combined read and write magnetic head 540. An actuator 535 rotatably positions the suspension and actuator arm 530 over the magnetic disk 520. The components of the hard disk drive 500 may be mounted on a housing 545. It is to be understood that although FIG. 1 illustrates a single disk 520, a single slider 525, a single head 540, and a single suspension and actuator arm 530, hard disk drive 500 may include a plurality (i.e., more than one) of disks 520, sliders 525, heads 540, and suspension and actuator arms 530.

The slider 525 has a gas-bearing surface that faces the surface of the disk 520 and counteracts a preload bias that pushes the slider toward the disk 520. For convenience, in this document the gas-bearing surface is referred to as the air-bearing surface (ABS) and the gas is generally referred to as "air," although it is to be understood that the gas used in a hard disk drive 500 may be a gas other than air (e.g., the gas may be helium). For simplicity, throughout this disclosure, the surface of the slider 525 that faces or that will eventually face the disk 520 is referred to as the ABS.

As the disk 520 rotates, the disk 520 drags air under the slider 525 and along the ABS in a direction approximately parallel to the tangential velocity of the disk 520. As the air passes under the ABS, air compression along the air flow path causes the air pressure between the disk 520 and the ABS to increase, which creates a hydrodynamic lifting force that counteracts the tendency of the suspension and actuator arm 530 to push the slider 525 toward the disk 520. The slider 525 thus flies above the disk 520 but in close proximity to the surface of the disk 520.

In operation, the actuator 535 moves the suspension and actuator arm 530 to position the slider 525 so that the magnetic head 540 is in a transducing relationship with the surface of the magnetic disk 520. The head 540 may be used to write information to one or more tracks on the surface of the disk 520 and to read previously-recorded information from the tracks on the surface of the disk 520. Processing circuitry 510 provides to the head 540 signals representing information to be written to the disk 520 and receives from the head 540 signals representing information read from the disk 520. The processing circuitry 510 also provides signals to the spindle motor to rotate the magnetic disk 520, and to the actuator 535 to move the slider 525 to various tracks.

For writing, the head 540 may use a single pole writer that has a main pole surrounded by magnetic shield materials. The main pole is typically separated from the magnetic shield materials by a non-magnetic spacer. The main pole may have a tapered shape with a tip that faces the magnetic recording media and is part of the ABS. The single pole writer may include a conductive coil encircling the writer pole in a helical or pancake like configuration.

To write to the disk 520, the slider 525 passes over a region of the disk 520, and an electric current is applied through the coil of the head 540, which causes a large magnetic field to be generated from the main pole tip. The polarity of the generated field causes a region of the magnetic disk 520 to assume a polarity, thus enabling information to be stored on the disk 520.

To read information from the disk 520, the head 540 may include only one read sensor, or it may include multiple read sensors. The read sensor(s) in the head 540 may include, for example, one or more giant magnetoresistance (GMR) sensors, tunneling magnetoresistance (TMR) sensors, or another type of magnetoresistive sensor. When the slider 525 passes over a region of the disk 520, the head 540 detects changes in resistance due to magnetic field variations recorded on the disk 520, which represent the recorded bits.

Figure 2:
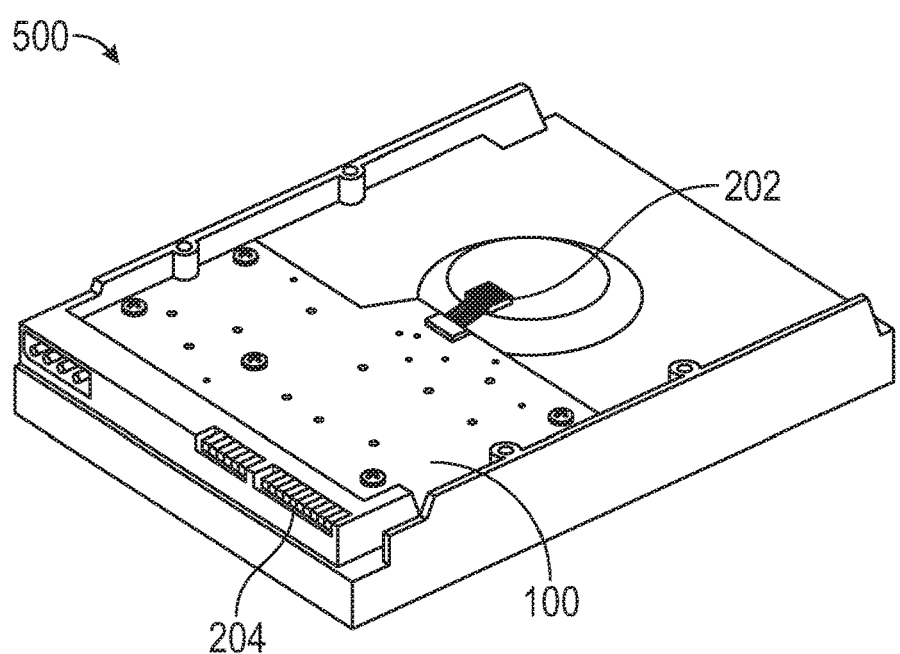
FIG. 2 is a schematic bottom illustration of a hard disk drive that includes a printed circuit board.

FIG. 2 is a schematic bottom illustration of a hard disk drive 500 including a PCB 100. The PCB 100 has electrical connections 202 to other components of the hard disk drive 500 and electrical connections 204 to be used to connect the hard disk drive 500 to a device (e.g., a computer) that will use the hard disk drive 500.

Hard disk drives 500 utilize serial interface input/output electrical lines, and the serial attached small (SAS) computer-system interface, which may inherently generate common-mode interference signals at frequencies that are multiples of 6 GHz, i.e., 6 GHz, 12 GHz, 18 GHz, and 24 GHz at SAS trace. Prior-art solutions to filter out such common-mode interference signals suffer from various deficiencies, such as not providing sufficient notch depths at the affected frequencies, or being too large or too numerous to fit on the surface of a PCB.

Figure 3A:
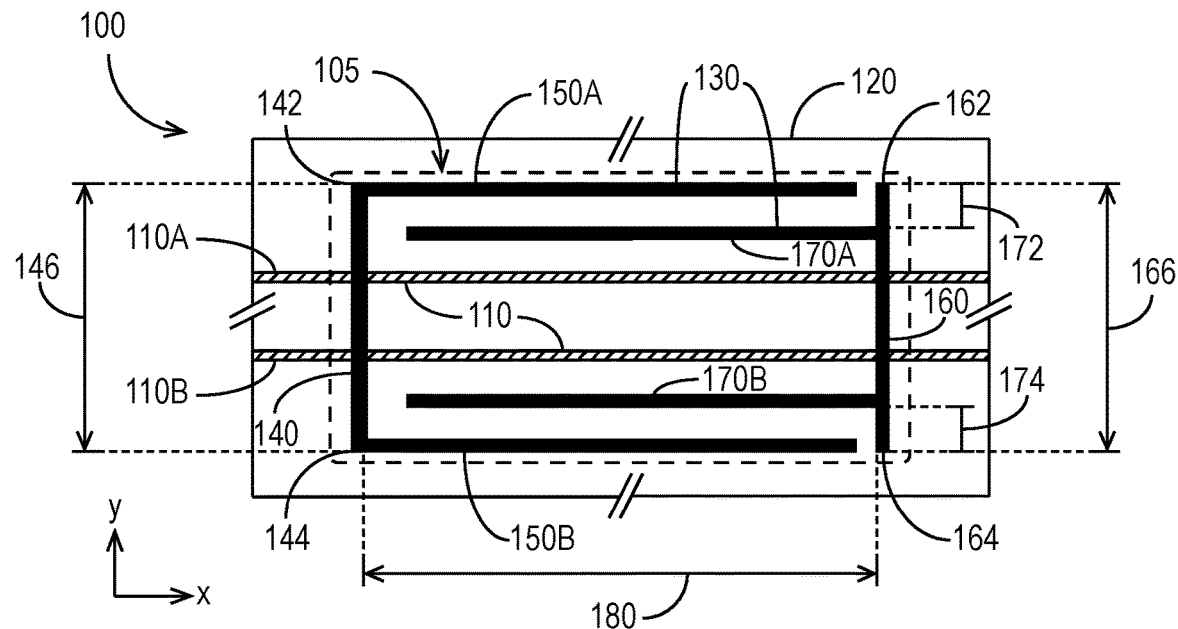
FIG. 3A illustrates a common-mode filter in a PCB in accordance with some embodiments.

FIG. 3A illustrates a common-mode filter 105 in a portion of a PCB 100 in accordance with some embodiments. FIG. 3A shows only the portion of the PCB 100 that includes the filter 105, but for simplicity, the portion of the PCB 100 will be referred to herein as "the PCB 100." For ease of explanation, a rectangular coordinate system is used to explain the orientation of the PCB 100 and its components, with the surfaces of the PCB 100 and its layers arbitrarily designated to be in the x-y plane as indicated in FIG. 3A. Thus, FIG. 3A illustrates the PCB 100 layers from above or below, viewed in the x-y plane in a rectangular coordinate system. The z-axis extends out of the page, toward the reader. The filter 105 comprises gaps in the reference plane 120 (e.g., a ground plane), which also resides in the x-y plane. The gaps are in a pattern 130, which, for clarity of illustration, is denoted by thick dark lines. Thus, the presentation in FIG. 3 is similar to a negative of a photograph, in that the gaps, which are areas in which material has been removed, are shown as dark lines, whereas the rest of the reference plane 120, from which material has not been removed, is shown without any shading. The gaps may have any suitable width or widths. For example, the gaps may be approximately 2 mm wide.

The filter 105 has two disjoint portions, each of which is a gap created (e.g., by etching) in the reference plane 120. One portion is a looping structure that has a first base 140 and an even number of side arms 150. In the embodiment shown in FIG. 3A, the looping structure has two side arms, 150A and 150B. Using the rectangular coordinate system established for FIG. 3A, the first base 140 extends along or parallel to the y-axis and has a first end 142, a second end 144, and a length 146. The first side arm 150A is connected to the first end 142, and the second side arm 150B is connected to the second end 144. The two side arms 150A, 150B are substantially perpendicular to the first base 140 and therefore extend along or parallel to the x-axis. Thus, the looping structure has the shape of an open rectangle, i.e., a rectangle missing one of its sides, or the shape of the capital Greek letter pi.

The first base 140 and the first and second side arms 150A, 150B may have any suitable dimensions. As examples of suitable dimensions, the length 146 may be between approximately 2 and 3 mm, the first and second side arms 150A, 150B may be between approximately 3 and 5 mm, and the first base 140 and first and second side arms 150A, 150B may be between 1 and 3 mm wide. In some embodiments, the length 146 is approximately 2.6 mm, the length of the first and second side arms 150A, 150B is approximately 3.8 mm, and the widths of the first base 140 and the first and second side arms 150A, 150B is approximately 2 mm.

The other portion of the filter 105 is a parallel structure that has a second base 160 and an even number of interior arms 170. In the embodiment illustrated in FIG. 3A, the parallel structure has two interior arms, 170A and 170B. The second base 160, which extends along or parallel to the y-axis and is, therefore, substantially parallel to the first base 140, has a first end 162, a second end 164, and a length 166. In some embodiments, the length 166 of the second base 160 is substantially equal to the length 146 of the first base 140. In other embodiments, the length of the first base 140 is greater than or less than the length 166 of the second base 160. The first base 140 and second base 160 are separated by a distance 180, sometimes referred to herein as the length of the filter 105. The first and second interior arms 170A, 170B extend along or parallel to the x-axis and are, therefore, substantially perpendicular to the second base 160 and substantially parallel to the first and second side arms 150A, 150B. The first interior arm 170A is connected to the second base 160 at a first distance 172 from the first end 162 of the second base 160. The second interior arm 170B is connected to the second base 160 at a second distance 174 from the second end 164 of the second base 160. In the embodiment illustrated in FIG. 3A, the second distance 174 is approximately equal to the first distance 172, but in other embodiments the second distance 174 is not approximately equal to the first distance 172. It is desirable for the distances 172, 174 to be approximately equal because imbalances along a differential signal path will create undesirable common-mode interference. The first and second distances 172, 174 may be, for example, between 0.3 mm and 1 mm. In some embodiments, the first and second distances 172, 174 are approximately 0.6 mm. In the embodiment shown in FIG. 3A, the first and second interior arms 170A, 170B are situated between and in the same x-y plane as the first and second side arms 150A, 150B. In the embodiment illustrated in FIG. 3A, the parallel structure has a shape similar to the lowercase Greek symbol "pi" (i.e., π, but with linear segments).

The second base 160 and the first and second interior arms 170A, 170B may have any suitable dimensions. As examples of suitable dimensions, the length 166 may be between approximately 2 and 3 mm, the first and second interior arms 170A, 170B may be between approximately 3 and 5 mm, and the second base 160 and first and second interior arms 170A, 170B may be between 1 and 3 mm wide. In some embodiments, the length 166 is approximately 2.6 mm, the length of the first and second interior arms 157A, 170B is approximately 3.6 mm, and the widths of the second base 160 and the first and second interior arms 170A, 170B is approximately 2 mm.

In the embodiment shown in FIG. 3A, the lengths of the side arms 150A, 150B are slightly longer than the lengths of the interior arms 170A, 170B. For example, the side arms 150A, 150B may be approximately 3.8 mm long, and the interior arms 170A, 170B may be approximately 3.6 mm long. In other embodiments, the lengths of the side arms 150A, 150B may be equal to or shorter than the lengths of the interior arms 170A, 170B. Furthermore, as explained further below, the filter 105 may include additional pairs of side arms 150 or interior arms 170. In the embodiment of FIG. 3A, the side arms 150A, 150B and the interior arms 170A, 170B are all shorter than the distance 180 between the first base 140 and the second base 160.

As shown in FIG. 3A, the side arms 150A, 150B of the looping structure extend toward the parallel structure, and the interior arms 170A, 170B of the parallel structure extend toward the looping structure. The looping structure and the parallel structure are said to be "interlocked," in that the parallel and looping structures are disjoint, and the first and second interior arms 170A, 170B reside between the first and second side arms 150A, 150B at some point between the first base 140 and the second base 160. In other words, the looping structure and the parallel structure are interlocked because at least one cross-section of the PCB 100 taken parallel to the y-axis at some point along the x-axis between the first base 140 and the second base 160 intersects both of the first and second interior arms 170A, 170B and both of the first and second side arms 150A, 150B. For example, in the embodiment illustrated in FIG. 3A, a cross section parallel to the y-axis taken at the midpoint between the first base 140 and the second base 160 would intersect all of the first and second interior arms 170A, 170B and the first and second side arms 150A, 150B. Of course, there are also many other points along the x-axis for which a cross-section parallel to the y-axis would intersect both of the first and second interior arms 170A, 170B and both of the first and second side arms 150A, 150B.

As shown in FIG. 3A, at least one signal trace 110 extends in an x-y plane residing under (or over) the reference plane 120. The at least one signal trace 110 is offset from the reference plane 120 by some distance in the z-direction. Using the rectangular coordinate system established for FIG. 3A, the at least one signal trace 110 extends along or parallel to the x-axis. As shown in FIG. 3A, when the PCB 100 is viewed from above or below the reference plane 120, along or parallel to the z-axis, the at least one signal trace 110 appears to pass between the first and second side arms 150A, 150B and between the first and second interior arms 170A, 170B. Thus, the at least one signal trace 110 is said to be "situated between" the first and second side arms 150A, 150B and situated between the first and second interior arms 170A, 170B, even though the at least one signal trace 110 is in a different x-y plane (i.e., the at least one signal trace 110 is offset in the z-direction) from the filter 105.

FIG. 3A illustrates two signal traces 110A, 110B, which may be, for example, differential signal traces or single-ended signal traces. The PCB 100 may include more or fewer signal traces 110 than shown in FIG. 3A, and these signal traces may be filtered by the filter 105. For example, a single signal trace 110 may pass through the filter 105 equidistant from the first and second side arms 150A, 150B and equidistant from the first and second interior arms 170A, 170B (assuming that the first and second distances 172, 174 are substantially the same). Alternatively, more than two signal traces 110 may be situated between the first and second side arms 150A, 150B and the first and second interior arms 170A, 170B. The signal traces 110 situated between the first and second side arms 150A, 150B and the first and second interior arms 170A, 170B may be single-ended traces, differential traces, or a combination of the two. Of course, for differential signaling, if one signal trace of a differential pair passes through the filter 105, the other signal trace of that differential pair should also pass through the filter 105 to maintain the desirable properties of differential signaling described previously.

Figure 3B:
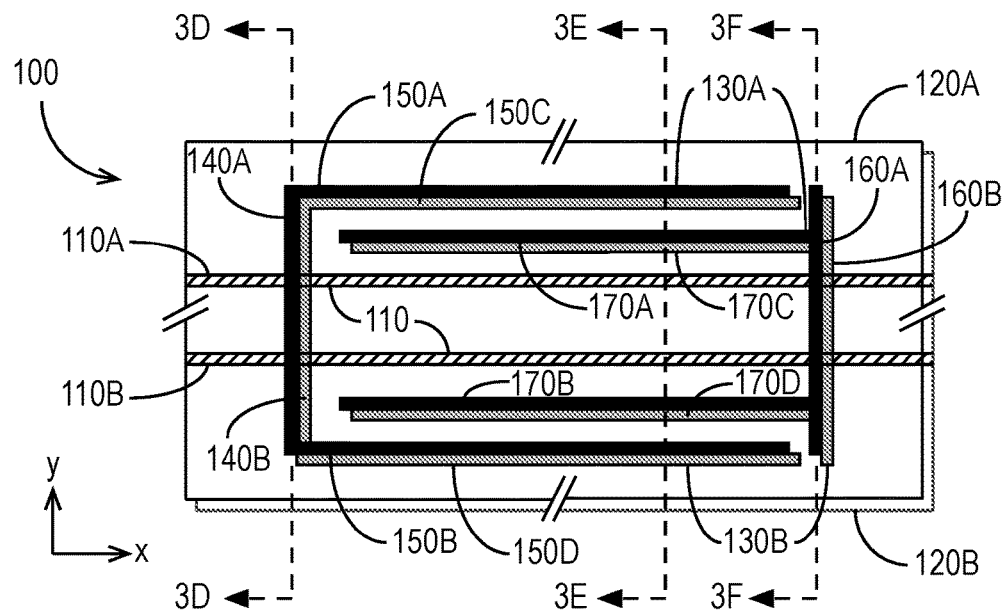
FIG. 3B illustrates another common-mode filter in a PCB in accordance with some embodiments.

FIG. 3A illustrates an exemplary filter 105 implemented in a single reference plane 120 of the PCB 100. FIG. 3B illustrates another common-mode filter 105 in a PCB 100 in which the filter 105 is implemented in two reference planes 120 in accordance with some embodiments. For ease of illustration, the two reference planes 120A and 120B are shown slightly offset from each other in the x- and y-directions. Thus, FIG. 3B illustrates the PCB 100 layers from above or below, showing x-y planes along a z-axis in a rectangular coordinate system, but with the two reference planes 120A and 120B slightly offset in the x- and y-directions to allow the lower reference plane 120B to be seen, assuming the material of the upper reference plane 120A enables features of the offset lower reference plane 120B to be seen through what would otherwise be opaque portions of the upper reference plane 120A. As illustrated, the upper reference plane 120A and the lower reference plane 120B have identical patterns 130A, 130B in locations in the x-y plane that are identical when the upper and lower reference planes 120A, 120B are aligned (i.e., not offset as shown in FIG. 3B). In other words, absent the offset, if viewed along the z-axis from a vantage point above or below the PCB 100, the patterns 130A, 130B would overlap so that the pattern 130B would be obscured by the pattern 130A when viewed from above, and vice versa when viewed from below.

The two patterns 130A, 130B have the same characteristics and relationships as described above for filter 105 in the context of FIG. 3A. Specifically, the upper reference plane 120A pattern 130A includes two disjoint portions, each of which is a gap created (e.g., by etching) in the reference plane 120A. One portion is a looping structure that has a first base 140A and an even number of side arms 150. In FIG. 3B, the looping structure of the pattern 130A has two side arms, 150A and 150B. The first base 140A extends along or parallel to the y-axis and has a first end 142A, a second end 144A, and a length 146 (labeled in FIG. 3A but not labeled in FIG. 3B to avoid unnecessarily complicating FIG. 3B). The first side arm 150A is connected to the first end 142A, and the second side arm 150B is connected to the second end 144A. The two side arms 150A, 150B are substantially perpendicular to the first base 140A and therefore extend along or parallel to the x-axis.

The other portion of the filter 105 is a parallel structure that has a second base 160A and an even number of interior arms 170. In the embodiment of FIG. 3B, the parallel structure has two interior arms, 170A and 170B. The second base 160A, which extends along or parallel to the y-axis and is, therefore, substantially parallel to the first base 140A, has a first end 162A, a second end 164A, and a length 166 (labeled in FIG. 3A but not labeled in FIG. 3B to avoid unnecessarily complicating FIG. 3B). In some embodiments, the length 166 of the second base 160A is substantially equal to the length 146 of the first base 140A. In other embodiments, the length of the first base 140A is greater than or less than the length 166 of the second base 160A. The first and second interior arms 170A, 170B extend along or parallel to the x-axis and are, therefore, substantially perpendicular to the second base 160A and substantially parallel to the first and second side arms 150A, 150B. The first interior arm 170A is connected to the second base 160A at a first distance 172 (labeled in FIG. 3A but not labeled in FIG. 3B to avoid unnecessarily complicating FIG. 3B) from the first end 162A of the second base 160A. The second interior arm 170B is connected to the second base 160A at a second distance 174 (labeled in FIG. 3A but not labeled in FIG. 3B to avoid unnecessarily complicating FIG. 3B) from the second end 164A of the second base 160A. In the embodiment illustrated in FIG. 3B, the second distance 174 is approximately equal to the first distance 172. Thus, the first and second interior arms 170A, 170B are situated between the first and second side arms 150A, 150B.

The lower reference plane 120B pattern 130B includes two disjoint portions, each of which is a gap in the reference plane 120B. One portion is a looping structure, identical to the looping structure in the pattern 130A, that has a third base 140B and two side arms, 150C and 150D. The third base 140B extends along or parallel to the y-axis and has a first end 142B, a second end 144B, and a length 146 (not illustrated in FIG. 3B, but corresponding to those shown in FIG. 3A). The length of the third base 140B is substantially identical to the length of the first base 140A. The third side arm 150C is connected to the first end 142B, and the fourth side arm 150D is connected to the second end 144B. The two side arms 150C, 150D are substantially perpendicular to the third base 140B and therefore extend along or parallel to the x-axis. The lengths of the side arms 150C, 150D are substantially identical to the lengths of the side arms 150A, 150B.

The other portion of the filter 105 is a parallel structure, identical to the parallel structure in the pattern 130A, that has a fourth base 160B and two interior arms, 170C and 170D. The fourth base 160B, which extends along or parallel to the y-axis and is, therefore, substantially parallel to the third base 140B, has a first end 162B, a second end 164B, and a length 166 (not illustrated in FIG. 3B, but easily located by referencing FIG. 3A). The length of the fourth base 160B is substantially identical to the length of the second base 160A. In some embodiments, the length 166 of the fourth base 160B is substantially equal to the length 146 of the third base 140B. In other embodiments, the length of the third base 140B is greater than or less than the length 166 of the fourth base 160B. The third and fourth interior arms 170C, 170D extend along or parallel to the x-axis and are, therefore, substantially perpendicular to the fourth base 160B and substantially parallel to the third and fourth side arms 150C, 150D. The third interior arm 170C is connected to the fourth base 160B at a first distance 172 (not illustrated in FIG. 3B, but easily located by referencing FIG. 3A) from the first end 162B of the fourth base 160B. The fourth interior arm 170D is connected to the fourth base 160B at a second distance 174 (not illustrated in FIG. 3B, but easily located by referencing FIG. 3A) from the second end 164B of the fourth base 160B. In the embodiment illustrated in FIG. 3B, the second distance 174 is approximately equal to the first distance 172. Thus, the third and fourth interior arms 170C, 170D are situated between the third and fourth side arms 150C, 150D. The lengths of the third and fourth interior arms 170C, 170D are substantially identical to the lengths of the first and second interior arms 170A, 170B.

At least one signal trace 110 extends in an x-y plane residing between the upper reference plane 120A and the lower reference plane 120B. The at least one signal trace 110 is offset in the z-direction from each of the upper and lower reference planes 120A, 120B. Using the rectangular coordinates established for FIG. 3A, the at least one signal trace 110 extends along or parallel to the x-axis. As shown in FIG. 3B, the at least one signal trace 110 is situated between the first and second side arms 150A, 150B, between the third and fourth side arms 150C, 150D, between the first and second interior arms 170A, 170B, and between the third and fourth interior arms 170C, 170D, where the meaning of "situated between" was explained in the context of FIG. 3A.

Like FIG. 3A, FIG. 3B illustrates two signal traces 110A, 110B, but more or fewer signal traces 110 may pass through the filter 105, and these signal traces 110 may be single-ended traces, differential traces, or a combination of the two.

Figure 3C:
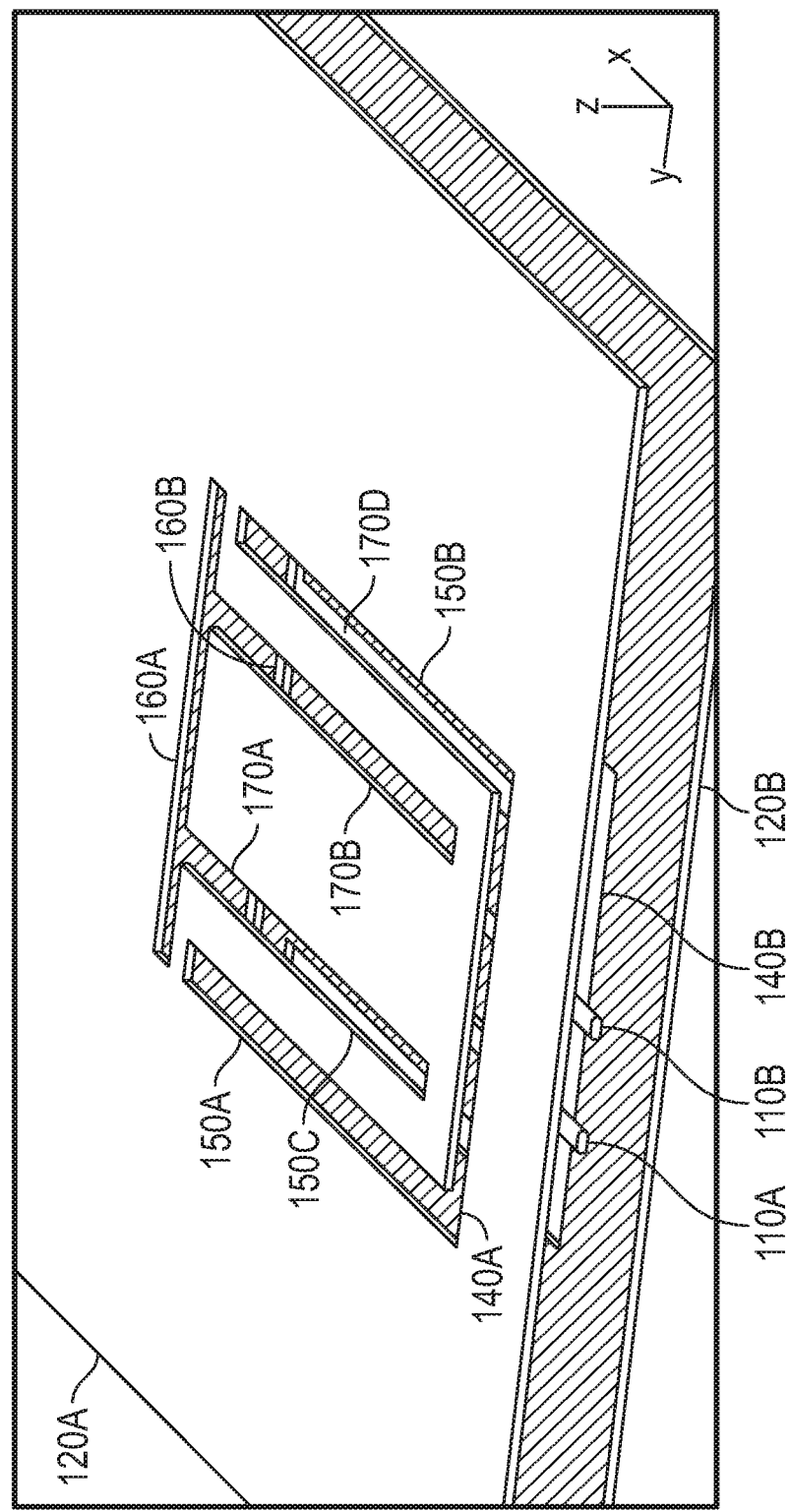
FIG. 3C is an isometric view of the PCB illustrated in FIG. 3B.

FIG. 3C is an isometric view of the PCB 100 illustrated in FIG. 3B. FIG. 3C shows the signal traces 110A and 110B residing in an x-y plane located between the upper and lower reference planes 120A, 120B. The signal traces 110A, 110B extend along or parallel to the x-axis, situated between the first and second side arms 150A, 150B and between the first and second interior arms 170A, 170B of the upper reference plane 120A. Although not completely visible in FIG. 3C because the reference planes 120A, 120B are illustrated as solid and the patterns 130A, 130B are illustrated as gaps in the reference planes 120A, 120B, the signal traces 110A, 110B are also situated between the third and fourth side arms 150C, 150D and between the third and fourth interior arms 170C, 170D of the lower reference plane 120B.

Figure 3D:
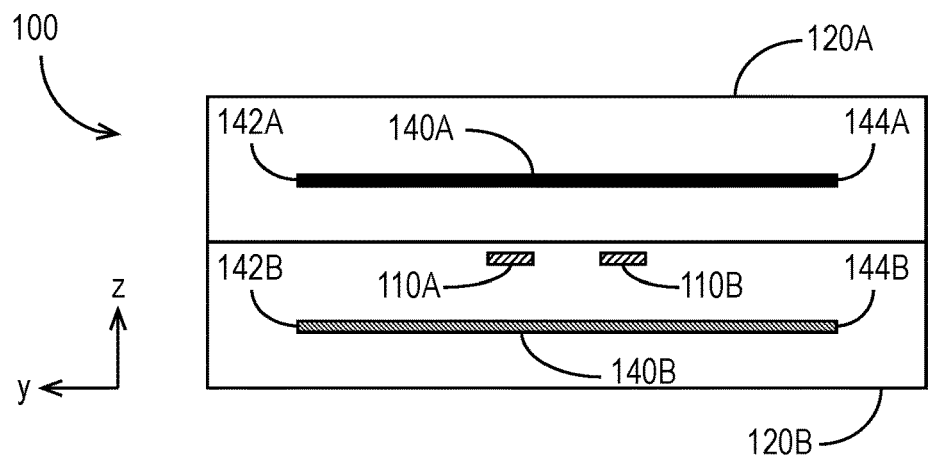
FIG. 3D is a cross-sectional view of the PCB shown in FIG. 3B.

FIG. 3D is a cross-sectional view of the PCB 100 shown in FIG. 3B at the dashed line 3D-3D, which is parallel to the y-axis. Thus, the cross-section is in a y-z plane. The cross-section intersects the first base 140A and the third base 140B, as well as the signal traces 110A and 110B. As explained above and illustrated in FIG. 3D, the first and third bases 140A, 140B are gaps in the reference planes 120A and 120B.

Figure 3E:
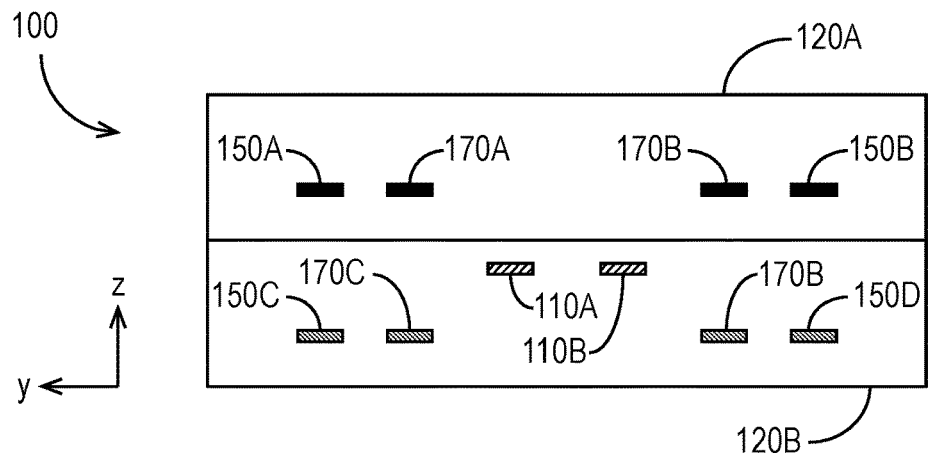
FIG. 3E is another cross-sectional view of the PCB shown in FIG. 3B.

FIG. 3E is a cross-sectional view of the PCB 100 shown in FIG. 3B at the dashed line 3E-3E, which is also parallel to the y-axis, yielding another cross-section in a y-z plane. The cross-section intersects the first and second side arms 150A, 150B and the first and second interior arms 170A, 170B of the patterns 130A, 130B in the reference layer 120A; the third and fourth side arms 150C, 150D and the third and fourth interior arms 170C, 170D of the patterns 130C, 130D in the reference layer 120B; and the two signal traces 110A, 110B. FIG. 3E is an exemplary cross-section illustrating that the looping and parallel structures of FIG. 3B are interlocked as explained above, and that the signal traces 110A, 110B are (a) situated between the first and second side arms 150A, 150B, (b) situated between the first and second interior arms 170A, 170B, (c) situated between the third and fourth side arms 150C, 150D, and (d) situated between the third and fourth interior arms 170C, 170D, where the meaning "situated between" was explained above.

Figure 3F:
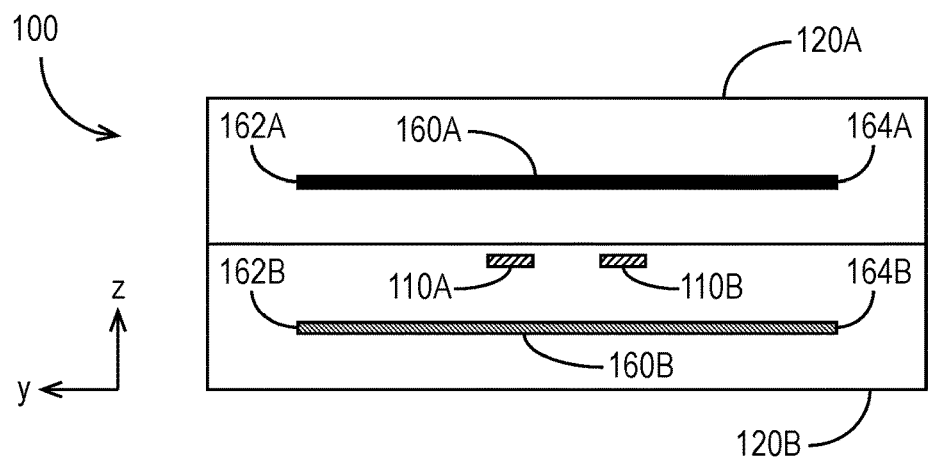
FIG. 3F is another cross-sectional view of the PCB shown in FIG. 3B.

FIG. 3F is a cross-sectional view of the PCB 100 shown in FIG. 3B at the dashed line 3F-3F, which is also parallel to the y-axis, yielding another cross-section in a y-z plane. The cross-section intersects the second base 160A and the fourth base 160B, as well as the signal traces 110A and 110B. As explained above and illustrated in FIG. 3F, the second and fourth bases 160A, 160B are gaps in the reference planes 120A and 120B.

Figure 4A:
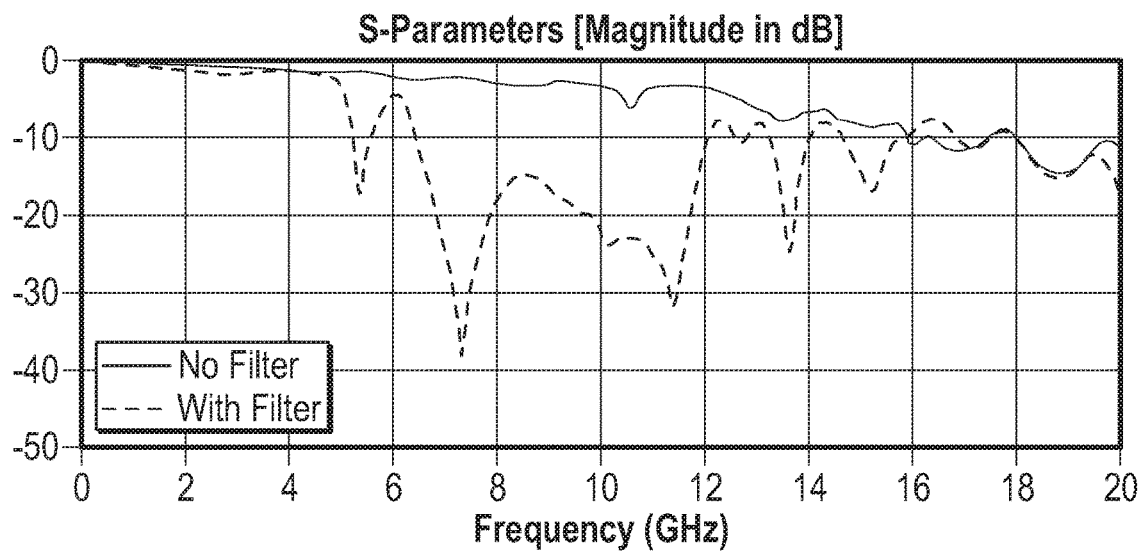
FIG. 4A is a plot illustrating the effect of the common-mode filter shown in FIG. 3B on a common-mode signal.

FIG. 4A is a plot illustrating the effect of the common-mode filter 105 shown in FIG. 3B on the common-mode signal when the two signal traces 110A, 110B are used for differential signaling. The dimensions of the filter 105 are as follows: the lengths 146, 166 are equal and approximately 2.6 mm; the lengths of the first, second, third, and fourth side arms 150A, 150B, 150C, 150D are equal and approximately 3.8 mm; the lengths of the first, second, third, and fourth interior arms 170A, 170B, 170C, 170D are equal and approximately 3.6 mm; the first, second, third, and fourth distances (not explicitly identified in FIG. 3B but easily located based on the first and second distances 172, 174 shown in FIG. 3A) are approximately 0.6 mm; and the widths of the first base 140A, second base 160A, third base 140B, fourth base 160B, first, second, third, and fourth side arms 150A, 150B, 150C, 150D, and first, second, third, and fourth interior arms 170A, 170B, 170C, 170D is approximately 2 mm. The solid line illustrates the S-parameters, in dB, without the common-mode filter 105. The dashed line illustrates that the common-mode filter 105 shown in FIG. 3B causes a wideband attenuation in the common-mode signal. Specifically, the filter 105 provides at least 10 dB of common-mode signal attenuation in the band between approximately 6.5 GHz and 11.5 GHz.

Figure 4B:
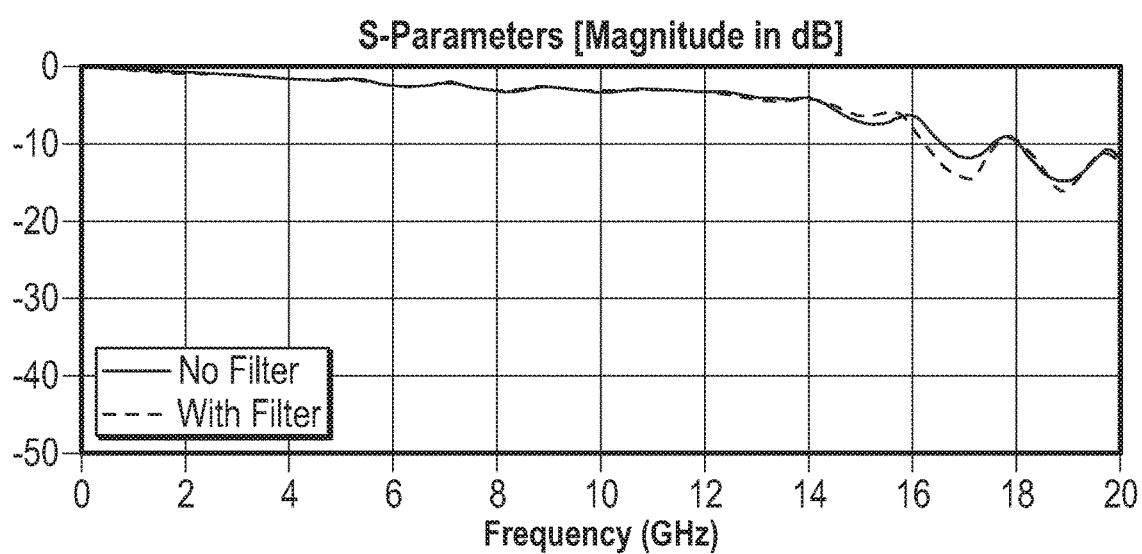
FIG. 4B is a plot illustrating the effect of the common-mode filter shown in FIG. 3B on a differential signal.

FIG. 4B is a plot illustrating that the common-mode filter 105 shown in FIG. 3B has little effect on the differential signal. The solid line illustrates the S-parameters, in dB, without any common-mode filter, and the dashed line illustrates the S-parameters, in dB, with the common-mode filter 105 of FIG. 3B with the dimensions described in the context of FIG. 4A. As indicated in FIG. 4B, the common-mode filter has no impact on the differential signal transfer at frequencies up to 14 GHz. Notably, the common-mode filter 105 has no effect on the differential signal transfer within the band between 6.5 GHz and 11.5 GHz, in which the filter 105 provides at least 10 dB of common-mode interference suppression. Thus, when the signal traces 110A, 110B are filtered by the common-mode filter 105, the common-mode interference signal in the band from approximately 6.5 GHz to 11.5 GHz reaches the receiver at a significantly attenuated level (at least 10 dB down), but the common-mode filter 105 does not appreciably impact the differential signal.

Figure 5:
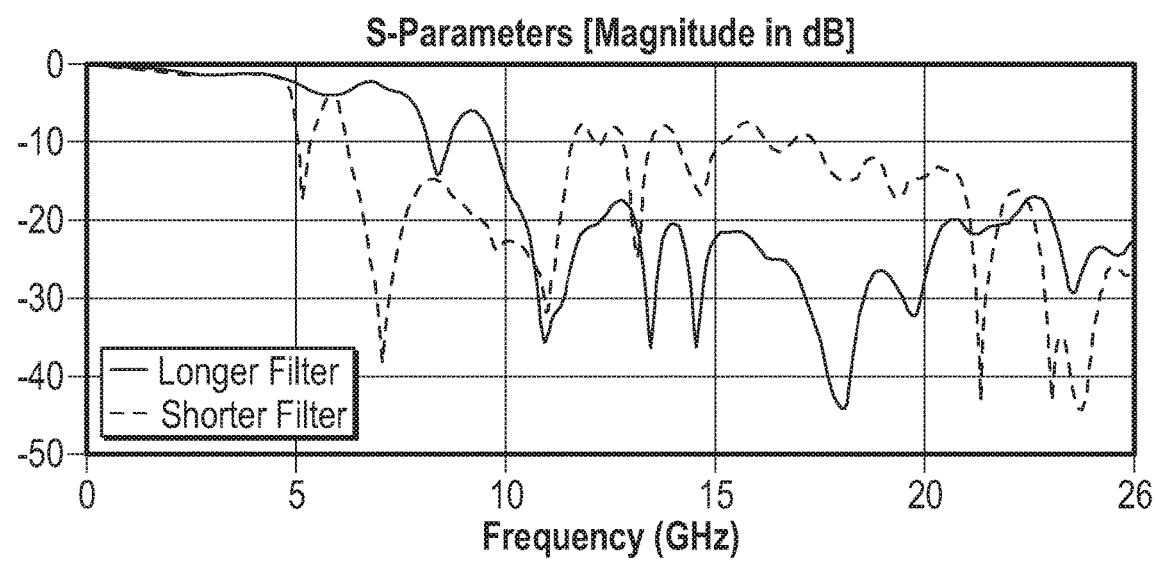
FIG. 5 is a plot illustrating the effect of the length of the common-mode filter shown in FIG. 3B on its S-parameters.

FIG. 5 is a plot illustrating the effect of the length of the common-mode filter 105 (i.e., the distance 180 shown in FIG. 3B between the first base 140 and second base 160) on its S-parameters. The solid curve illustrates the S-parameters, in dB, of the common-mode filter 105 shown in FIG. 3B when the distance 180 is 4 mm and the other dimensions are as described in the context of FIG. 3A. The 4-mm filter 105 provides at least 10 dB of common-mode signal attenuation in the band between approximately 6.5 GHz and 11.5 GHz. The dashed curve illustrates the S-parameters, in dB, of the common-mode filter 105 of FIG. 3B when the distance 180 is reduced to 2.2 mm, and the lengths of the side arms 150 and interior arms 170 are adjusted accordingly. As shown in FIG. 5, the shorter common-mode filter 105 has more of a low-pass response, and it attenuates common-mode signals above 10 GHz by more than 10 dB. Thus, by selecting the distance 180 between the first base 140 and the second base 160 of the common-mode filter 105, the frequency band in which common-mode noise is attenuated can be adjusted.

Figure 6:
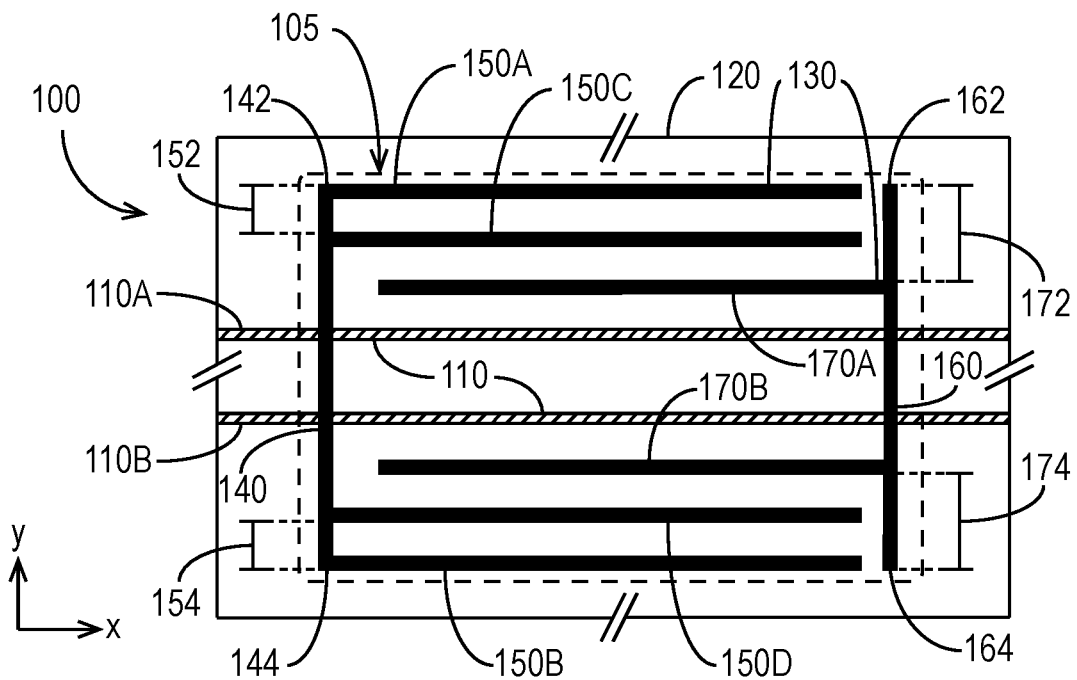
FIG. 6 illustrates a common-mode filter having additional capacitive structure in accordance with some embodiments.

In addition to tuning the filter 105 by changing the distance 180 between the first base 140 and second base 160, the behavior of the common-mode filter 105 may be adjusted or tuned by adding capacitance or inductance in the looping and/or parallel structures that make up the filter 105. For example, FIG. 6 illustrates a PCB 100 with a common-mode filter 105 having additional capacitance in accordance with some embodiments. For simplicity, FIG. 6 illustrates a filter 105 embodied in only a single reference plane 120, but it is to be appreciated that the PCB 100 may include the same pattern 130 in a second reference plane in the manner shown and described in the context of FIG. 3B (i.e., in a substantially identical location in the x-y plane so that the patterns 130 align when viewed along or perpendicular to the z-axis, with at least one signal trace 110 residing between the two reference planes 120 and situated between the side arms 150 and interior arms 170).

In the embodiment of FIG. 6, in addition to the side arms 150A and 150B, the looping structure includes two additional side arms, 150C and 150D, which are offset from the side arms 150A and 150B. The side arm 150C is offset from the first end 142 of the first base 140 by a distance 152, and the side arm 150D is offset from the second end 144 of the first base 140 by a distance 154. In some embodiments, the distance 152 is substantially equal to the distance 154. In the embodiment shown in FIG. 6, the distance 152 is smaller than the distance 172 by which the first interior arm 170A is offset from the first end 162 of the second base 160, and the distance 154 is smaller than the distance 174 by which the second interior arm 170B is offset from the second end 164 of the second base 160. Thus, the interior arms 170A, 170B are closer to the at least one signal trace 110 (shown as signal traces 110A, 110B in FIG. 6) than any of the side arms 150A, 150B, 150C, 150D. FIG. 6 illustrates an embodiment in which the third and fourth side arms 150C, 150D have substantially the same lengths as the first and second side arms 150A, 150B. In other embodiments, the third and fourth side arms 150C, 150D may be shorter or longer than the first and second side arms 150A, 150B.

Figure 7:
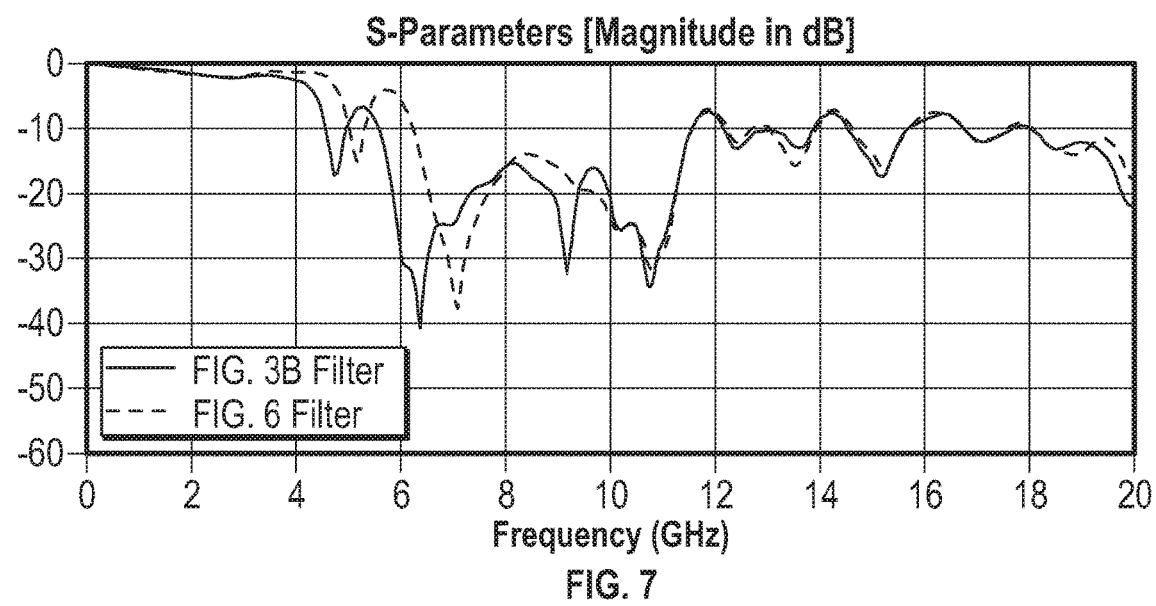
FIG. 7 is a plot illustrating the effect of the extra capacitance of the common-mode filter of FIG. 6 relative to the common-mode filter illustrated in FIG. 3B.

FIG. 7 is a plot illustrating the effect of including extra capacitive structure in the common-mode filter 105 relative to the common-mode filter illustrated in FIG. 3B. The solid curve illustrates the S-parameters, in dB, of the common-mode filter 105 shown in FIG. 3B with the dimensions as described in the context of FIG. 3A. The filter 105 illustrated in FIG. 3B provides at least 10 dB of common-mode signal attenuation in the band between approximately 6.5 GHz and 11.5 GHz. The dashed curve illustrates the S-parameters, in dB, of a common-mode filter 105 in which the pattern 130 shown in FIG. 6 is etched into each of two reference layers 120 as described in the context of FIG. 3B. It is to be appreciated that similar performance is expected with a filter 105 implemented in a single reference layer 120, though potentially with a shallower stopband. As shown in FIG. 7, the addition of the side arms 150C and 150D in the pattern 130 increases the width of the rejection band. The filter 105 using the pattern 130 of FIG. 6 in each of two reference layers provides at least 10 dB of common-mode signal attenuation in the band from approximately 5.5 GHz to 11.5 GHz. Thus, by increasing the capacitance of the filter 105 by adding side arms 150C, 150D as illustrated in the exemplary embodiment of FIG. 6, the frequency band in which common-mode noise is attenuated can be adjusted.

Figure 8:
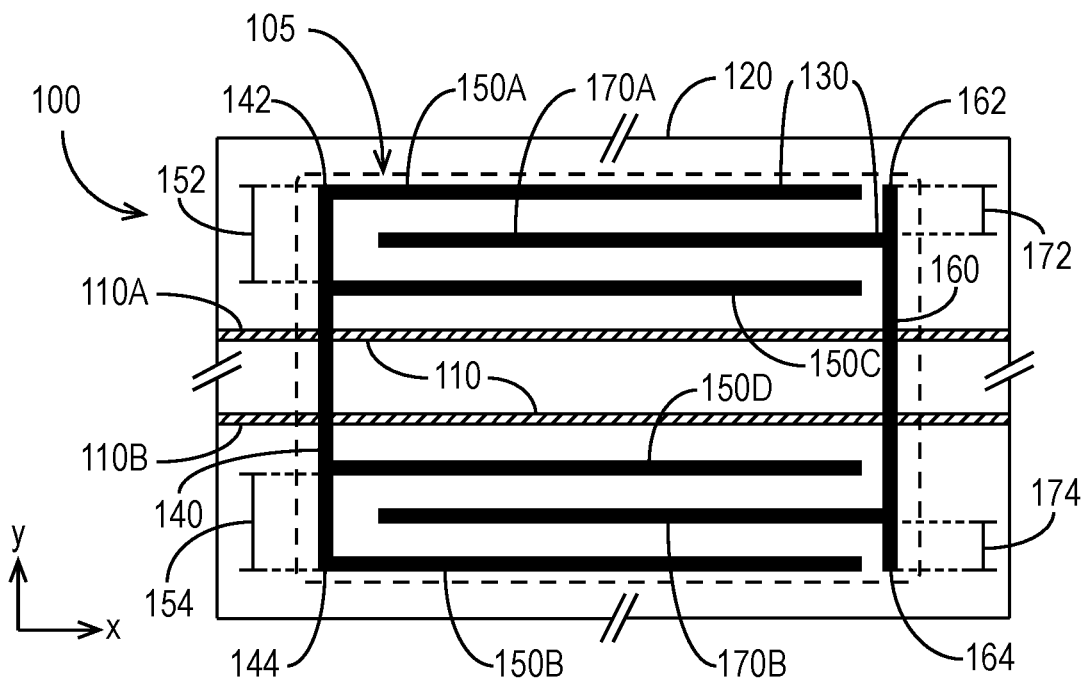
FIG. 8 illustrates a common-mode filter having additional inductive structure in accordance with some embodiments.

FIG. 8 illustrates a PCB 100 with a common-mode filter 105 having additional inductive structure in accordance with some embodiments. For simplicity, FIG. 8 illustrates a filter 105 embodied in only a single reference plane 120, but it is to be appreciated that the PCB 100 may include the same pattern 130 in a second reference plane 120 in the manner shown and described in the context of FIG. 3B (i.e., in a substantially identical location in the x-y plane so that the patterns 130 align when viewed along or perpendicular to the z-axis, with at least one signal trace 110 residing between the two reference planes and situated between even numbers of side arms 150 and interior arms 170). In the embodiment of FIG. 8, in addition to the side arms 150A and 150B, the looping structure includes two additional side arms, 150C and 150D, which are offset from the side arms 150A and 150B. The side arm 150C is offset from the first end 142 of the first base 140 by a distance 152, and the side arm 150D is offset from the second end 144 of the first base 140 by a distance 154. In some embodiments, the distance 152 is substantially equal to the distance 154. In the embodiment shown in FIG. 8, the distance 152 is larger than the distance 172 by which the first interior arm 170A is offset from the first end 162 of the second base 160, and the distance 154 is larger than the distance 174 by which the second interior arm 170B is offset from the second end 164 of the second base 160. Thus, each of the interior arms 170A, 170B is flanked by two side arms 150 (i.e., the interior arm 170A extends between the side arms 150A and 150C, and the interior arm 170B extends between the side arms 150B and 150D). FIG. 8 illustrates an embodiment in which the third and fourth side arms 150C, 150D have substantially the same lengths as the first and second side arms 150A, 150B. In other embodiments, the third and fourth side arms 150C, 150D may be shorter or longer than the first and second side arms 150A, 150B.

Figure 9:
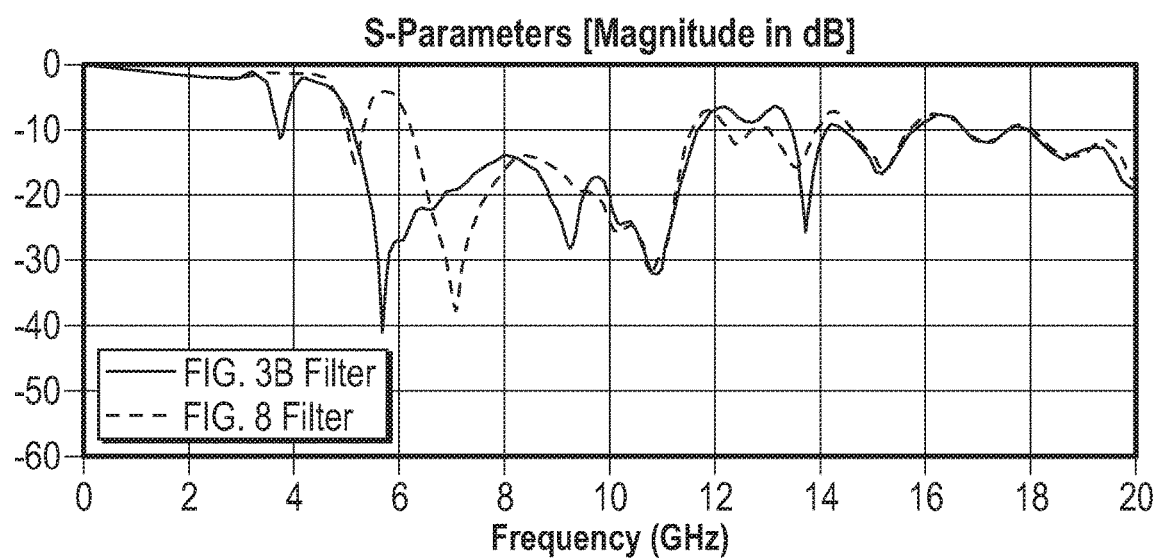
FIG. 9 is a plot illustrating the effect of the extra inductance of the common-mode filter of FIG. 8 relative to the common-mode filter illustrated in FIG. 3B.

FIG. 9 is a plot illustrating the effect of including extra inductance in the common-mode filter 105 relative to the common-mode filter 105 illustrated in FIG. 3B. The solid curve illustrates the S-parameters, in dB, of the common-mode filter shown in FIG. 3B. The filter 105 illustrated in FIG. 3B provides at least 10 dB of common-mode signal attenuation in the band between approximately 6.5 GHz and 11.5 GHz. The dashed curve illustrates the S-parameters, in dB, of a common-mode filter 105 in which the pattern 130 shown in FIG. 8 is etched into each of two reference layers 120 as described in the context of FIG. 3B. It is to be appreciated that similar performance is expected with a filter 105 implemented in a single reference layer 120, though potentially with a shallower stopband. As shown in FIG. 9, the addition of the side arms 150C and 150D as illustrated in FIG. 8 also increases the width of the rejection band. The filter 105 shown in FIG. 8 provides at least 10 dB of common-mode signal attenuation in the band from approximately 5 GHz to 11.5 GHz. Thus, by increasing the inductance of the filter 105 by adding side arms 150C, 150D as illustrated in the exemplary embodiment of FIG. 8, the frequency band in which common-mode noise is attenuated can be adjusted.

Figure 10:
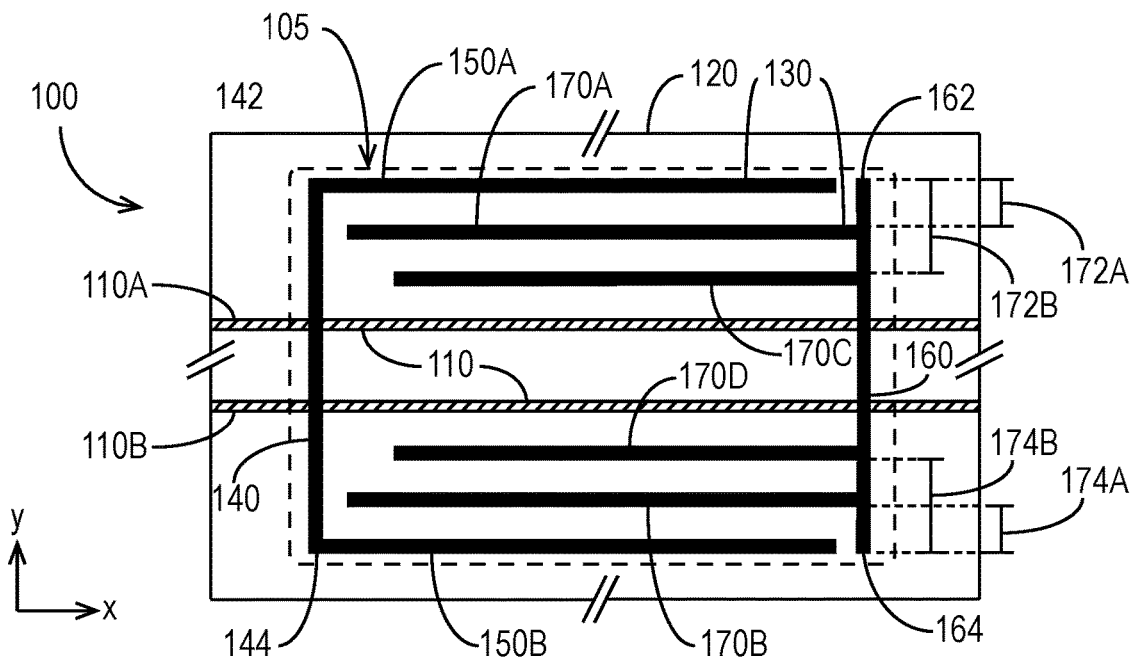
FIG. 10 illustrates a common-mode filter having additional capacitive structure in accordance with some embodiments.

Although FIGS. 6 and 8 show looping structures with four side arms 150, as explained previously, the looping structure may include any even number of side arms 150. Likewise, the parallel structure may include any even number of interior arms 170. FIG. 10 illustrates a PCB 100 with a common-mode filter 105 having additional capacitive structure in accordance with some embodiments. For simplicity, FIG. 10 illustrates a filter 105 embodied in only a single reference plane 120, but it is to be appreciated that the PCB 100 may include the same pattern 130 in a second reference plane 120 in the manner shown and described in the context of FIG. 3B (i.e., in a substantially identical location in the x-y plane so that the patterns 130 align when viewed along or perpendicular to the z-axis, with at least one signal trace 110 residing between the two reference planes and situated between even numbers of side arms 150 and interior arms 170). In the embodiment of FIG. 10, in addition to the interior arms 170A and 170B, the parallel structure includes two additional interior arms, 170C and 170D, which are offset from the interior arms 170A and 170B. Whereas the interior arm 170A is offset from the first end 162 of the second base 160 by a distance 172A, the interior arm 170C is offset from the first end 162 of the second base 160 by a distance 172B. Similarly, whereas the interior arm 170B is offset from the second end 164 of the second base 160 by a distance 174A, the interior arm 170D is offset from the second end 164 of the second base 160 by a distance 174B. In some embodiments, the distance 172A is substantially equal to the distance 174B, and the distance 172B is substantially equal to the distance 174B. FIG. 10 illustrates an embodiment in which the third and fourth interior arms 170C, 170D are shorter than the first and second interior arms 170A, 170B. In other embodiments, the third and fourth interior arms 170C, 170D may be the same length as or longer than the first and second interior arms 170A, 170B.

Figure 11:
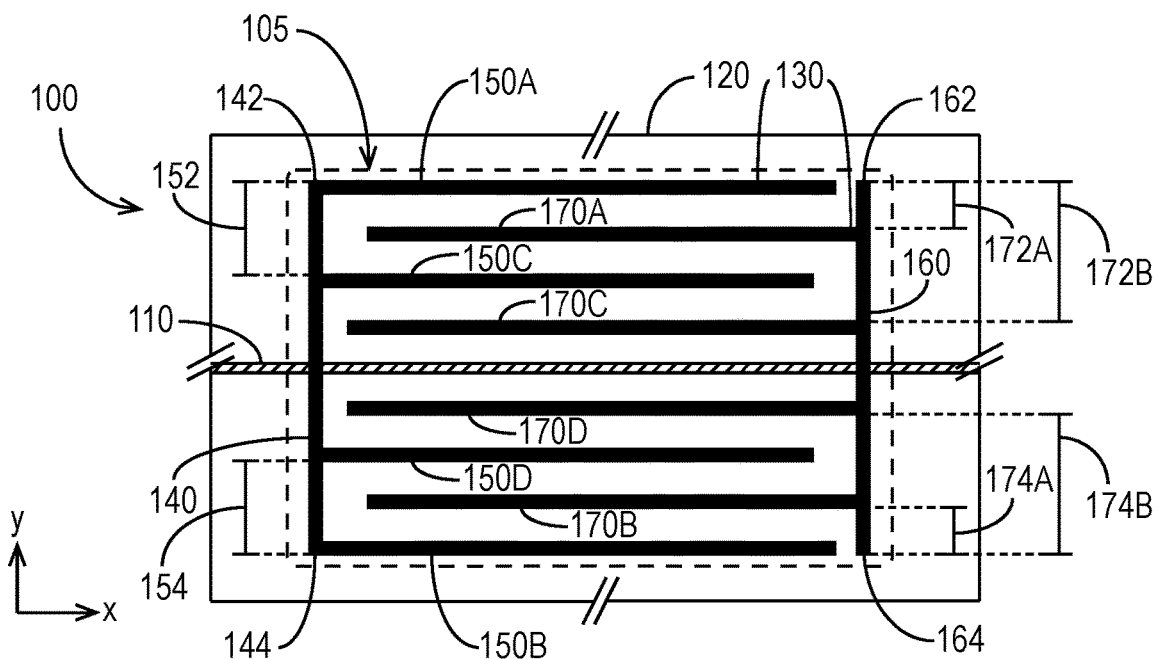
FIG. 11 illustrates a common-mode filter having additional inductive structure in accordance with some embodiments.

FIG. 11 illustrates a PCB 100 with a common-mode filter 105 having additional inductive structure in accordance with some embodiments. For simplicity, FIG. 11 illustrates a filter 105 embodied in only a single reference plane 120, but it is to be appreciated that the PCB 100 may include the same pattern 130 in a second reference plane 120 in the manner shown and described in the context of FIG. 3B (i.e., in a substantially identical location in the x-y plane so that the patterns 130 align when viewed along or perpendicular to the z-axis, with at least one signal trace 110 residing between the two reference planes and situated between even numbers of side arms 150 and interior arms 170). In the embodiment of FIG. 11, in addition to the interior arms 170A and 170B, the parallel structure includes two additional interior arms, 170C and 170D, which are offset from the interior arms 170A and 170B. Whereas the interior arm 170A is offset from the first end 162 of the second base 160 by a distance 172A, the interior arm 170C is offset from the first end 162 of the second base 160 by a distance 172B. Similarly, whereas the interior arm 170B is offset from the second end 164 of the second base 160 by a distance 174A, the interior arm 170D is offset from the second end 164 of the second base 160 by a distance 174B. In some embodiments, the distance 172A is substantially equal to the distance 174B, and the distance 172B is substantially equal to the distance 174B. FIG. 10 illustrates an embodiment in which the third and fourth interior arms 170C, 170D are longer than the first and second interior arms 170A, 170B. In other embodiments, the third and fourth interior arms 170C, 170D may be the same length as or shorter than the first and second interior arms 170A, 170B.

In the embodiment of FIG. 11, in addition to the side arms 150A and 150B, the looping structure includes two additional side arms, 150C and 150D, which are offset from the side arms 150A and 150B. The side arm 150C is offset from the first end 142 of the first base 140 by a distance 152, and the side arm 150D is offset from the second end 144 of the first base 140 by a distance 154. In some embodiments, the distance 152 is substantially equal to the distance 154. In the embodiment shown in FIG. 11, the distance 152 is larger than the distance 172A by which the first interior arm 170A is offset from the first end 162 of the second base 160, and the distance 154 is larger than the distance 174A by which the second interior arm 170B is offset from the second end 164 of the second base 160. Thus, the first and second interior arms 170A, 170B are both flanked by two side arms 150 (i.e., the interior arm 170A extends between the side arms 150A and 150C, and the interior arm 170B extends between the side arms 150B and 150D). FIG. 11 illustrates an embodiment in which the third and fourth side arms 150C, 150D are shorter than the first and second side arms 150A, 150B. In other embodiments, the third and fourth side arms 150C, 150D may be substantially the same length as or longer than the first and second side arms 150A, 150B.

Although patterns 130 illustrated in the drawings herein have, respectively side arms 150 and interior arms 170 that are parallel to the at least one signal trace 110, the side arms 150 and interior arms 170 are not required to be parallel to the at least one signal trace 110. For example, the side arms 150 and/or interior arms 170 may extend at angles relative to the at least one signal trace 110.

Used by themselves, the filters 105 disclosed herein provide substantial attenuation of common-mode noise in (or caused by the circuits of) PCBs. By modifying the filter length, capacitance, and inductance as explained herein, the frequency response of the filter can be adjusted without the need for surface components (e.g., capacitors or inductors) on the PCB 100. It is to be understood, however, that surface components may be used in conjunction with the filters disclosed herein to further adjust the filter characteristics. For example, to adjust the characteristics of the filter 105, a surface component, such as a capacitor or an inductor, may be coupled at any position between the first and second side arms 150 or at any position between the first and second interior arms 170 in embodiments such as those shown in FIGS. 3A and 3B. Similarly, in embodiments including more than two side arms 150, surface components (e.g., capacitors and/or inductors) may be coupled between the first and third side arms 150A, 150C; between the first and second side arms 150A, 150B; between the third and fourth side arms 150C, 150D; and/or between the second and fourth side arms 150B, 150D. Likewise, in embodiments including more than two interior arms 170, surface components may be coupled between the first and third interior arms 170A, 170C; between the first and second interior arms 170A, 170B; between the third and fourth interior arms 170C, 170D; and/or between the second and fourth interior arms 170B, 170D.

In the foregoing description and in the accompanying drawings, specific terminology has been set forth to provide a thorough understanding of the disclosed embodiments. In some instances, the terminology or drawings may imply specific details that are not required to practice the invention.

Although this document explains aspects of certain embodiments in the context of data storage devices, using hard disk drives as examples of data storage devices, the disclosures herein are not limited to use in data storage device applications. Specifically, the various embodiments are applicable to other electronic devices with noise/interference mitigation needs. Furthermore, although certain embodiments are explained in the context of hard disk drives, and some of the drawings show a hard disk drive as an example data storage device, the various embodiments are applicable to other data storage devices such as solid state drives, solid state hybrid disk drives, optical disk drives, tape drives, and the like.

To avoid obscuring the present disclosure unnecessarily, well-known components (e.g., of a disk drive) are shown in block diagram form and/or are not discussed in detail or, in some cases, at all.

Unless otherwise specifically defined herein, all terms are to be given their broadest possible interpretation, including meanings implied from the specification and drawings and meanings understood by those skilled in the art and/or as defined in dictionaries, treatises, etc. As set forth explicitly herein, some terms may not comport with their ordinary or customary meanings.

As used in the specification and the appended claims, the singular forms "a," "an" and "the" do not exclude plural referents unless otherwise specified. The word "or" is to be interpreted as inclusive unless otherwise specified. Thus, the phrase "A or B" is to be interpreted as meaning all of the following: "both A and B," "A but not B," and "B but not A." Any use of "and/or" herein does not mean that the word "or" alone connotes exclusivity.

As used herein, phrases of the form "at least one of A, B, and C," "at least one of A, B, or C," "one or more of A, B, or C," and "one or more of A, B, and C" are interchangeable, and each encompasses all of the following meanings: "A only," "B only," "C only," "A and B but not C," "A and C but not B," "B and C but not A," and "all of A, B, and C."

To the extent that the terms "include(s)," "having," "has," "with," and variants thereof are used in the detailed description or the claims, such terms are intended to be inclusive in a manner similar to the term "comprising," i.e., meaning "including but not limited to." The terms "exemplary" and "embodiment" are used to express examples, not preferences or requirements.

The terms "over," "under," "between," and "on" are used herein refer to a relative position of one feature with respect to other features. For example, one feature disposed "over" or "under" another feature may be directly in contact with the other feature or may have intervening material. Moreover, one feature disposed "between" two features may be directly in contact with the two features or may have one or more intervening features or materials. In contrast, a first feature "on" a second feature is in contact with that second feature.

The drawings are not necessarily to scale, and the dimensions, shapes, and sizes of the features may differ substantially from how they are depicted in the drawings.

Although specific embodiments have been disclosed, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A printed circuit board, comprising:
   at least one signal trace extending in a first direction; and
   a first signal reference plane comprising a pattern, the pattern comprising:

a first base having a first end and a second end, the first base extending in a second direction, the second direction being substantially perpendicular to the first direction;
a second base having a first end and a second end, the second base being substantially parallel to the first base;
a first side arm connected to the first end of the first base, wherein the first side arm is substantially parallel to the at least one signal trace and extends toward the second base;
a second side arm connected to the second end of the first base, wherein the second side arm is substantially parallel to the first side arm and extends toward the second base;
a first interior arm connected to the second base at a first distance from the first end of the second base, wherein the first interior arm is substantially parallel to the first side arm and extends toward the first base; and
a second interior arm connected to the second base at a second distance from the second end of the second base, the second distance being substantially equal to the first distance, wherein the second interior arm is substantially parallel to the first side arm and extends toward the first base, wherein:
the at least one signal trace is situated between the first and second side arms and between the first and second interior arms,
a length of the first side arm is approximately equal to a length of the second side arm, and
a length of the first interior arm is approximately equal to a length of the second interior arm.

2. The printed circuit board recited in claim 1, further comprising a second signal reference plane comprising the pattern, wherein a location of the pattern in the second signal reference plane is substantially identical to a location of the pattern in the first signal reference plane, and wherein the at least one signal trace resides between the first and second signal reference planes.

3. The printed circuit board recited in claim 1, wherein the at least one signal trace comprises a single-ended signal trace.

4. The printed circuit board recited in claim 1, wherein the at least one signal trace comprises a first signal trace and a second signal trace, and wherein the first and second signal traces convey a differential-mode signal.

5. The printed circuit board recited in claim 1, wherein a length of the first base is substantially equal to a length of the second base.

6. The printed circuit board recited in claim 1, wherein a distance between the first base and the second base is between approximately 2 mm and 5 mm.

7. The printed circuit board recited in claim 1, further comprising at least one capacitor coupled between the first and second side arms.

8. The printed circuit board recited in claim 1, wherein the pattern further comprises:
a third side arm connected to the first base between the first side arm and the second side arm at a third distance from the first end of the first base, the third distance being less than the first distance, the third side arm being substantially parallel to the first side arm; and
a fourth side arm connected to the first base between the first side arm and the second side arm at a fourth distance from the second end of the first base, the fourth distance being less than the second distance, the fourth side arm being substantially parallel to the first side arm,
and wherein a length of the third side arm is approximately equal to a length of the fourth side arm.

9. The printed circuit board recited in claim 8, wherein the length of the third side arm differs from the length of the first side arm.

10. The printed circuit board recited in claim 8, further comprising at least one capacitor coupled between the first and third side arms, between the first and second side arms, between the third and fourth side arms, or between the second and fourth side arms.

11. The printed circuit board recited in claim 1, wherein the pattern further comprises:
a third side arm connected to the first base between the first side arm and the second side arm at a third distance from the first end of the first base, the third distance being greater than the first distance, the third side arm being substantially parallel to the first side arm; and
a fourth side arm connected to the first base between the first side arm and the second side arm at a fourth distance from the second end of the first base, the fourth distance being greater than the second distance, the fourth side arm being substantially parallel to the first side arm,
and wherein a length of the third side arm is approximately equal to a length of the fourth side arm.

12. The printed circuit board recited in claim 11, wherein the length of the third side arm differs from the length of the first side arm.

13. The printed circuit board recited in claim 11, further comprising at least one capacitor coupled between the first and second side arms.

14. A method of manufacturing the printed circuit board recited in claim 1, the method comprising etching the pattern into the first reference plane.

15. A data storage device comprising the printed circuit board recited in claim 1.

16. A printed circuit board, comprising:
at least one signal trace extending in a first direction, the at least one signal trace for conveying a signal on the printed circuit board; and
a broadband common-mode filter, comprising:
a looping structure etched into a signal reference plane of the printed circuit board, the looping structure comprising an even number of side arms, the even number of side arms being four, each of the side arms being substantially parallel to all of the other side arms; and
a parallel structure etched into the signal reference plane, the parallel structure comprising an even number of interior arms, the even number of interior arms being two, each of the interior arms being substantially parallel to the other interior arm and to all of the side arms, wherein:
each of the side arms extends toward the parallel structure,
each of the interior arms extends toward the looping structure,
the at least one signal trace is substantially parallel to the side arms and to the interior arms,
the at least one signal trace is situated between a first half of the even number of side arms and a second half of the even number of side arms, the at least one signal trace is situated between a first half of the even number of interior arms and a second half of the even number of interior arms, a first interior arm of the two interior arms is situated between a first side arm of the four side arms and a second side arm of the four side arms, and a second interior arm of the two interior arms is situated between a third side arm of the four side arms and a fourth side arm of the four side arms.

17. The printed circuit board recited in claim 16, wherein the at least one signal trace comprises a first signal trace and a second signal trace, and wherein a first distance between the first signal trace and a first nearest side arm of the four sides arms is approximately equal to a distance between the second signal trace and a second nearest side arm of the four sides arms.

18. The printed circuit board recited in claim 16, wherein the at least one signal trace comprises a first signal trace and a second signal trace, and wherein a first distance between the first signal trace and a first nearest interior arm of the two interior arms is approximately equal to a distance between the second signal trace and a second nearest interior arm of the two interior arms.

19. A data storage device comprising the printed circuit board recited in claim 16.

20. A method of manufacturing the printed circuit board recited in claim 16, the method comprising etching the broadband common-mode filter into the signal reference plane.

21. A printed circuit board, comprising:
at least one signal trace extending in a first direction, the at least one signal trace for conveying a signal on the printed circuit board; and
a broadband common-mode filter, comprising:
a looping structure etched into a signal reference plane of the printed circuit board, the looping structure comprising an even number of side arms, the even number of side arms being two, each of the side arms being substantially parallel to the other side arm; and
a parallel structure etched into the signal reference plane, the parallel structure comprising an even number of interior arms, the even number of interior arms being four, each of the interior arms being substantially parallel to all of the other interior arms and to all of the side arms, wherein:

each of the side arms extends toward the parallel structure, each of the interior arms extends toward the looping structure, the at least one signal trace is substantially parallel to the side arms and to the interior arms, the at least one signal trace is situated between a first half of the even number of side arms and a second half of the even number of side arms, the at least one signal trace is situated between a first half of the even number of interior arms and a second half of the even number of interior arms, a first side arm of the two side arms is situated between a first interior arm of the four interior arms and a second interior arm of the four interior arms, and a second side arm of the two side arms is situated between a third interior arm of the four interior arms and a fourth interior arm of the four interior arms.

22. A data storage device comprising the printed circuit board recited in claim 21.

23. A method of manufacturing the printed circuit board recited in claim 21, the method comprising etching the broadband common-mode filter into the signal reference plane.

* * * * *